United States Patent
Röhr et al.

(10) Patent No.: US 6,468,896 B2
(45) Date of Patent: Oct. 22, 2002

(54) METHOD OF FABRICATING SEMICONDUCTOR COMPONENTS

(75) Inventors: Thomas Röhr, Puchheim; Christine Dehm, München, both of (DE); Carlos Mazure-Espejo, Zorneding (FR)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/751,961

(22) Filed: Dec. 29, 2000

(65) Prior Publication Data

US 2001/0024873 A1 Sep. 27, 2001

Related U.S. Application Data

(63) Continuation of application No. PCT/DE99/01770, filed on Jun. 16, 1999.

(30) Foreign Application Priority Data

Jun. 29, 1998 (DE) .......................... 198 28 969

(51) Int. Cl.$^7$ .......................... H01L 21/4763
(52) U.S. Cl. ............ 438/637; 438/625; 438/636; 438/950
(58) Field of Search ................ 438/637, 950, 438/625, 636; 257/750, 769

(56) References Cited

U.S. PATENT DOCUMENTS

| 4,321,104 A | 3/1982 | Hasegawa et al. |
| 5,348,894 A | 9/1994 | Gnade et al. |
| 5,441,914 A | * 8/1995 | Taft et al. .................... 437/189 |
| 5,545,588 A | 8/1996 | Yoo |
| 5,677,111 A | 10/1997 | Ogawa |
| 5,700,737 A | 12/1997 | Yu et al. |
| 5,707,883 A | 1/1998 | Tabara |

FOREIGN PATENT DOCUMENTS

| DE | 196 01 592 C1 | 5/1997 |
| EP | 0 697 718 A1 | 2/1996 |
| WO | WO 99/41573 | 8/1999 |

OTHER PUBLICATIONS

Ekkehard Fluck et al.: "Allgemeine und anorganische Chemie"[general and anorganic chemistry], 4$^{th}$ edition, Heidelberg, 1984, p. 307; no month.

N. Yokoyama et al.: "0.1 $\mu$m Contact Metallization with $SiH_2F_2$–Reduced CVD W", 1992 Symposium on VLSI Technology Digest of Technical Papers, pp. 68–69.

* cited by examiner

*Primary Examiner*—Alexander Ghyka
(74) *Attorney, Agent, or Firm*—Laurence A. Greenberg; Werner H. Stemer; Gregory L. Mayback

(57) ABSTRACT

Disclosed is a method for producing semiconductor elements including a metal layer (10) configured on a semiconductor substrate (5). The inventive method consists of the following steps: a silicon layer (15) is deposited on a metal layer (10); an etch mask is applied in order to structure the silicon layer (1%); the silicon layer is selectively etched (15) using the etch mask (25); and the metal layer (10) is structured in an etching process using a selectively etched silicon layer (15) as a hard mask.

11 Claims, 2 Drawing Sheets

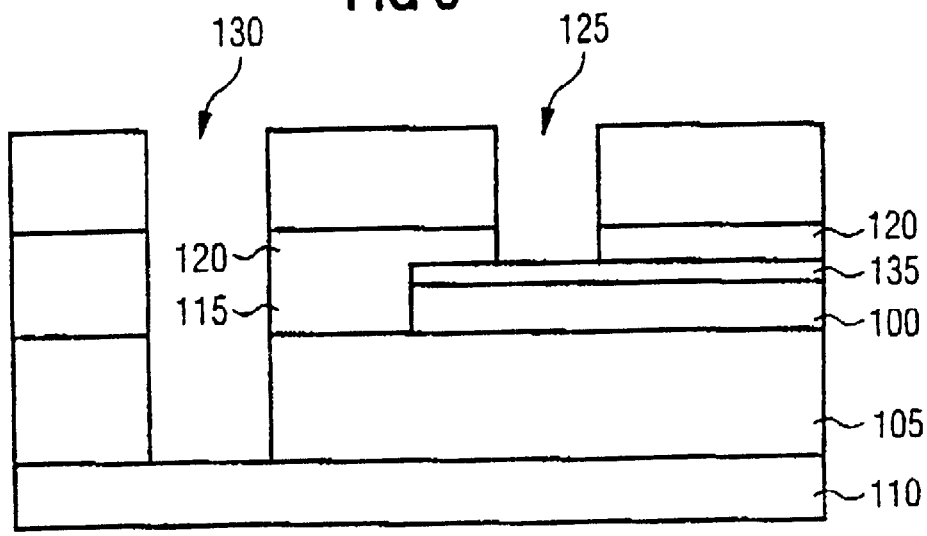
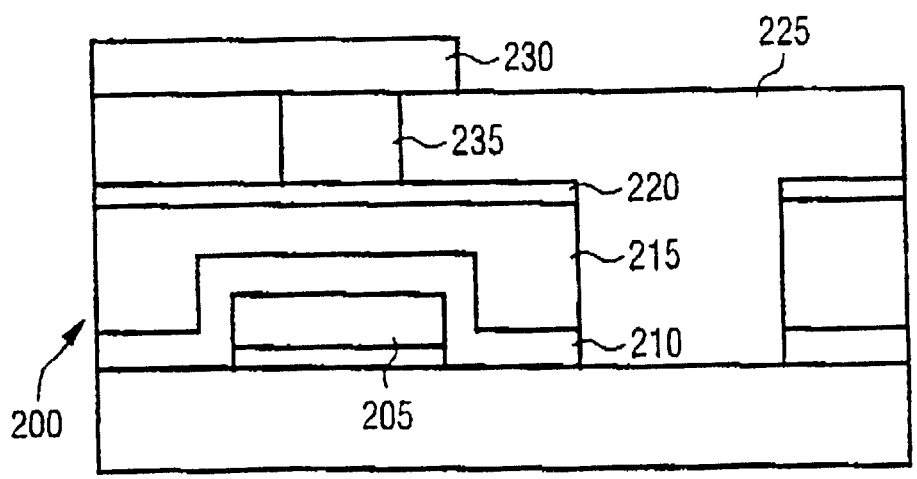

METHOD OF FABRICATING SEMICONDUCTOR COMPONENTS

CROSS-REFERENCE TO RELATED APPLICATION

This is a continuation of copending international application PCT/DE99/01770, filed Jun. 16, 1999, which designated the United States.

BACKGROUND OF THE INVENTION

Field of the Invention

The invention lies in the field of semiconductor technology and relates to a semiconductor component and to a method for fabricating it.

As the integration level continues to increase in conjunction with the accompanying reduction in feature size in semiconductor components, stringent demands are imposed on the structurally faithful fabrication of the semiconductor components. The layers to be patterned are composed of metal or doped polysilicon, for example.

A method for patterning a metal layer is disclosed in U.S. Pat. No. 5,700,737, for example. In the method described therein, an antireflection layer composed of titanium nitride, an etching stop layer composed of silicon nitride and a photoresist layer are successively deposited on a metal layer. This is followed by photolithographic patterning of the photoresist layer, which, for its part, subsequently serves as a mask for patterning the etching stop layer. In a further method step, the antireflection layer is patterned in accordance with the masking by the etching stop layer. Finally, the metal layer is patterned in an etching process. The etching stop layer together with the antireflection layer serves as a hard mask. This fabrication method is very complicated due to the use of a plurality of layers.

A further method for fabricating semiconductor components is described in U.S. Pat. No. 5,707,883. In the method therein, an antireflection layer composed of silicon nitride and a photoresist layer are used to mask a metal layer. After it has been patterned, the antireflection layer simultaneously serves as a hard mask during the etching of the metal layer. In this fabrication method, it is necessary to remove the electrically insulating antireflection layer, in particular when subsequently making contact with the metal layer.

N. Yokoyama et al., 1992 Symposium on VLSI Technology Digest of Technical Papers, New York, IEEE 1992, pp. 68–69 has disclosed, for example, the use of polysilicon as a mask for $SiO_2$ patterning in conjunction with subsequent metallization, the polysilicon mask being partially attacked during the $SiO_2$ patterning and subsequently having to be removed in order to avoid undesirable electrical connections.

SUMMARY OF THE INVENTION

It is accordingly an object of the invention to provide a semiconductor component and a method for fabricating a semiconductor component which overcomes the above-mentioned disadvantageous of the prior art components and methods of this general type, and which enables electrically conductive layers to be patterned in a simple manner.

With the foregoing and other objects in view there is provided, in accordance with the invention a method for fabricating a semiconductor component having an electrically conductive layer configured on a semiconductor substrate. The method includes applying a silicon mask layer to a conductive layer; applying an etching mask to the conductive layer for patterning the silicon mask layer; selectively etching the silicon mask layer using the etching mask; and patterning the conductive layer in an etching process using the selectively etched mask layer as a hard mask.

A silicon layer is used as a hard mask in an etching process for patterning the conductive layer. The silicon layer itself is masked beforehand by a photolithographically patternable layer, preferably by a photoresist, and etched. In a multiplicity of etching processes, silicon has high selectivity with respect to metals and other conductive materials, selectivity being understood to mean the ratio of the etching rate of the material to be etched to the etching rate of silicon. By virtue of this high selectivity, silicon is hardly attacked by the etching process and can thus advantageously be used as a hard mask. Furthermore, silicon is distinguished by the fact that it is more thermostable than other hard mask materials, for example titanium nitride. As a result, heat-treatment processes that may be necessary during the further fabrication of the semiconductor component can be carried out even at high temperatures without destroying the silicon layer. By virtue of the good adhesion of silicon on a multiplicity of materials, reliable adhesion of the silicon layer on the conductive layer is ensured throughout the process for patterning the conductive layer, and this contributes to structurally faithful etching of the layer.

In accordance with an added feature of the invention, the silicon layer remains on the conductive layer after the latter has been patterned, and is used as an adhesion promoting layer between the conductive layer and a further layer that is deposited.

The good adhesion properties of silicon can also advantageously be utilized for the purpose of promoting adhesion between layers made of different materials. This is advantageous particularly when the further deposited layer has poor adhesion properties with regard to the conductive layer. The silicon layer makes it possible to improve, in particular, the adhesion properties between two metal layers made of different metals and also between a metal layer and an oxide layer.

In accordance with an additional feature of the invention, the silicon layer is adapted in terms of its layer thickness for the purpose of reducing reflections during the photolithographic patterning of its etching mask.

Given an appropriate configuration of the silicon layer, the latter can also be used as an antireflection layer. In this case, the thickness of the silicon layer is set in accordance with the light wavelength used during the photolithography, so that the reflection of the light at the surface of the conductive layer is reduced through interference in the silicon layer. The suppression—obtained by means of the silicon layer—of disturbing reflections during the photolithographic patterning of its etching mask improves the structurally faithful formation of the silicon layer with respect to the hard mask and, as a result, the structurally faithful formation of the conductive layer.

In accordance with an another feature of the invention, the silicon layer serves as an etching stop for protecting the conductive layer.

When contact holes are created in an insulation layer for the purpose of making contact with the conductive layer, the silicon layer can also advantageously be used as an etching stop. In this case, when the insulation layer is being etched through, the silicon layer prevents the conductive layer configured under the insulation layer from being etched or even completely removed, and thereby protects the conductive layer against destruction.

In accordance with a further feature of the invention, during the etching of the contact holes, the material of which the conductive layer is composed is not uncovered in regions outside the contact holes. This avoids possible contamination of other layers or of the semiconductor base substrate and of process equipment (e.g. deposition installations) by the material (e.g. Pt, Al, Cu).

In accordance with a further added feature of the invention, the silicon layer is amorphous or polycrystalline.

The silicon layer can be deposited onto the conductive layer using various methods which are adapted to the materials used in each case for fabricating the conductive layer. If silicon is applied by a sputtering method, then an amorphous silicon layer is produced. In contrast to this, a polycrystalline silicon layer is formed in the case of silicon deposition by means of a CVD method (Chemical Vapor Deposition) or after a heat treatment—following the sputtering process—of the amorphous silicon layer. The hard mask properties of the silicon layer can advantageously be adapted to the respective etching processes by the choice of an amorphous or polycrystalline structure.

In accordance with a further additional feature of the invention, the silicon layer is doped.

In order to increase the electrical conductivity, particularly when making contact with the conductive layer, the silicon layer can be doped beforehand in a suitable manner. Possible parasitic capacitances can also be precluded as a result.

In accordance with yet an added feature of the invention, the silicon layer is used as a hard mask during the selective etching of a layer sequence including the conductive layer and a dielectric.

The use of the silicon layer for patterning the conductive layer and the dielectric leads to an identical structural formation of the two layers. In this case, the patterning can be effected in two successive etching processes which are optimally adapted to the respective materials (conductive layer, dielectric), or in a common etching step. The joint patterning of the conductive layer and dielectric is advantageous particularly in the fabrication of memory elements, since the relatively sensitive dielectric is protected against undesirable process influences by the conductive layer situated above it.

In accordance with yet an additional feature of the invention, the conductive layer is a metal layer.

The use of the silicon layer means that it is possible even to effect selective etching of metal layers or even noble metal layers in an outstanding manner. Advantages include, inter alia, the good adhesion of silicon on metals and high etching selectivity of the metals with respect to silicon. Structurally faithful and reliable etching of metal layers containing platinum, ruthenium or iridium, for example, is only possible with the use of silicon as a hard mask layer.

If the conductive layer is composed of a metal, a metal alloy or a metal silicide, a metal silicide layer may be formed between the conductive layer and the silicon layer. This metal silicide layer may be formed either before, during or after the etching of the conductive layer, the siliciding generally being effected by a treatment at elevated temperature. Preferably, the metal silicide layer is already formed before the etching process, in order to achieve the best possible adhesion between the conductive layer and the silicon layer.

The formation of a metal silicide layer between the metal layer and the silicon layer advantageously leads to a perfect ohmic contact between the metal layer and the silicon layer, with the result that the silicon layer does not have to be removed during a subsequent process of making contact with the metal layer. If the contact-making process is performed using a further metal layer, the silicon layer, with the formation of a further metal silicide layer, results in a good electrical connection being produced to the further metal or metal silicide layer.

Furthermore, the adhesion to further layers, e.g. oxidation layers which serve for insulating the conductive layer, is improved by the silicon layer.

In accordance with yet an another feature of the invention, the metal layer is composed of platinum, iridium, palladium, ruthenium or an alloy of at least one of the abovementioned metals.

The use of the silicon layer also advantageously allows the patterning and the etching of electrodes of the abovementioned materials which are used to fabricate memory cells having a small feature size whilst utilizing a dielectric having an extremely high dielectric constant. Oxide-ceramic materials, for example of the perovskite type, are predominantly employed as dielectrics. Preferred dielectrics, which may also have ferroelectric properties, are, inter alia, barium strontium titanate (BST), lead zirconium titanate (PZT) or strontium bismuth tantalate (SBT).

Moreover, the use of conductive oxides, for example iridium oxide or ruthenium oxide, for fabricating the conductive layer is advantageous.

Preferably, the fabrication method according to the invention is used to create a semiconductor component having a protective layer configured on a semiconductor substrate, the conductive layer being connected, with the interposition of a silicon layer as adhesion promoting layer, to a further layer and the conductive layer being composed of platinum, iridium, ruthenium, palladium or of an alloy of the abovementioned metals, or of iridium oxide or ruthenium oxide.

A semiconductor component according to the invention, having a noble metal layer configured on a semiconductor substrate, is described below, the noble metal layer being connected, with the interposition of a silicon layer as adhesion promoting layer, to a further layer. Instead of the noble metal, it is also possible to use any other of the materials specified above and also the metals copper, aluminum and tungsten.

A semiconductor component of this type is characterized in that a silicon layer having a direct contact with the noble metal layer serves as an adhesion promoting layer. The semiconductor component according to the invention thus has a layer sequence: noble metal layer—silicon layer—further layer, silicon layer being understood not to be a silicon base substrate. The silicon layer means that it is possible, in particular, to use noble metal layers having a low reactivity, for example platinum, in the fabrication of semiconductor components.

Other features which are considered as characteristic for the invention are set forth in the appended claims.

Although the invention is illustrated and described herein as embodied in a method for fabricating semiconductor components, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 shows the use of a silicon layer as an etching stop in the course of contact-hole etching; and FIG. 6 shows a semiconductor component according to the invention.

DESCRIPTION OF THE PREFERRED EMBODIMENTS

The fabrication method according to the invention will be described here using a storage capacitor as an example. Firstly, a bottom electrode is applied to an intermediate insulation layer. If appropriate, it may be expedient to deposit a barrier layer onto the intermediate insulation layer before the bottom electrode is applied. The barrier layer serves to promote adhesion between the bottom electrode and the intermediate insulation layer. The bottom electrode is preferably composed of platinum. A dielectric is conformally applied thereto using a CVD method. This dielectric is etched either separately or together with the conductive layer that is to be subsequently applied. The above-described layer sequence: barrier layer—metal layer—dielectric—conductive layer is illustrated in FIG. 6, for example. In order to simplify the illustration, the capacitor has been omitted from the illustration in FIGS. 1 to 4. In this case, however, the shown base substrate is intended to be representative of the capacitor and of further substrates.

A metal layer 10 which is essentially composed of platinum and represents the conductive layer 10 is deposited on a base substrate 5. Afterwards, a silicon layer 15 is applied, e.g. by sputtering, to the metal layer 10, followed by application of a photoresist layer 20. In a further method step, the photoresist layer 20 is patterned photolithographically. To that end, the photoresist layer is exposed selectively using a photomask or a reticle and is subsequently developed. In order to reduce disturbing reflections of the excitation light used during the photolithography at the metal layer 10, the thickness of the silicon layer 15 is chosen suitably and is about 100 nm. The reduction of reflections is essentially brought about by destructive interference in the silicon layer 15. This avoids undesirable exposure of individual masked regions of the photoresist layer 20. The resulting improved exposure contrast leads to distinctly higher structural faithfulness in the photoresist layer 20.

Figure 1:
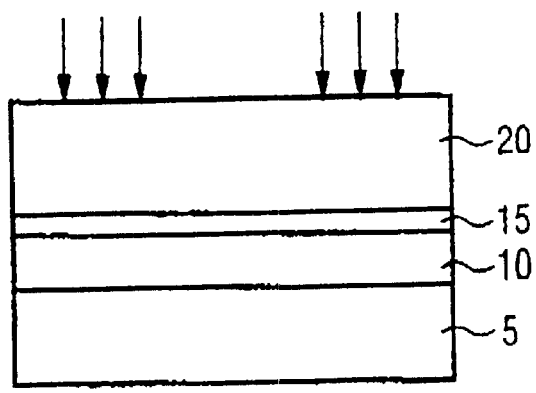
FIGS. 1 to 4 show individual steps of the fabrication method.
Figure 2:
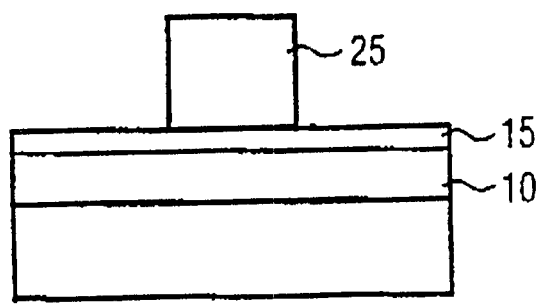
Figure 3:
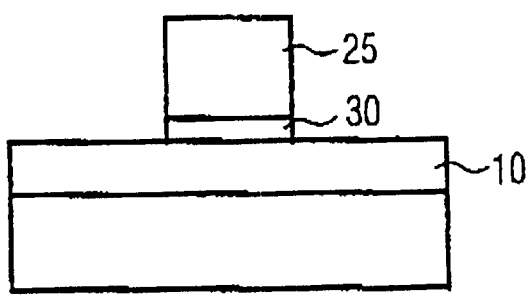
Figure 4:
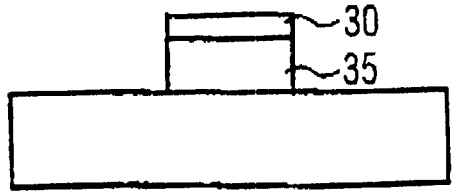

The photoresist layer 20 is exposed and then developed. Only the unexposed regions 25 of the photoresist layer 20 remain on the silicon layer 15 in the process. By contrast, the exposed regions remain after development when negative photoresist layers are used. The structurally faithful etching mask 25 created in this way serves, as illustrated in FIG. 2, as masking for etching the silicon layer 15. By means of an anisotropic etching operation, for example, the silicon layer 15 is patterned in accordance with the masking by the etching mask 25 of the photoresist layer 20, thereby producing a hard mask 30 including the remaining sections 30 of the silicon layer 15 and the etching mask 25. After removal of the etching mask 25, the hard mask 30 serves, in a subsequent etching process, for selectively masking the metal layer 10, which can be suitably patterned by means of a chemical-physical dry etching method, in which those regions of the metal layer 10 which are not covered by the hard mask 30 are removed. Consequently, all that remain on the base substrate 5 are regions 35 of the metal layer 10 which correspond to the originally non-exposed regions 25 of the photoresist layer 20. The unexposed regions 25 and thus the etching mask 25 are generally removed before the etching of the metal layer 10, with the result that a layer structure including only the regions 35 of the metal layer 10 and the hard mask 30 remain on the base substrate 5 after the etching step. The hard mask 30 remaining on the regions 35 of the metal layer 10 subsequently serves, on the one hand, as a means of promoting adhesion to further layers and, on the other hand, as a protective layer which prevents the metal layer 10 from being attacked during further process steps. At the same time, this prevents partial removal of the metal layer 10 and thus contamination of the base substrate 5. Moreover, the conductivity of the silicon layer 15 for making electrical contact with the metal layer 10 can be increased by suitable doping before or after the formation of the hard mask 30.

The fabrication method according to the invention can be used particularly advantageously for fabricating the top electrode of a storage capacitor. The silicon layer configured on the top electrode proves to be particularly favorable as adhesion-promoting and contact layer.

It goes without saying that other conductive layers can also be suitably patterned by the method according to the invention. The advantageous antireflection effect of the silicon layer makes it possible to achieve high structural faithfulness or reliability during the exposure and development of etching masks, which subsequently leads to a high etching quality. Consequently, it is possible to effect very accurate patterning of the conductive layer in individual regions of this layer that has been deposited over the whole area. In this case, the individual regions may be configured both within a memory cell array and peripherally.

The use of the silicon layer as an etching stop layer is illustrated in FIG. 5. In this case, a patterned metal layer 100 is configured such that it is electrically insulated from a base substrate 110 with the interposition of an intermediate oxide 105. The metal layer 100 and also the metal-layer-free regions 115 (regions that do not have the metal layer) are covered completely with a further intermediate oxide 120. After suitable masking of this further intermediate oxide layer 120, contact holes are etched into the layer and into the intermediate oxide layer 105. In the process, a first contact hole 125 is formed in the region of the metal layer 100 down to the latter through the intermediate oxide layer 120. A second contact hole 130 is etched in the metal-layer-free region 115 down to the base substrate 110 through the intermediate oxide layers 105 and 120. Since the individual contact holes 125 and 130 have different depths, overetching must be effected at least with regard to the first contact hole 125 in order that the second contact hole 130 can be formed with a sufficient depth. During this overetching, a silicon layer 135 which completely covers the metal layer 100 prevents damage to the metal layer 100. This silicon layer 135 thus acts as an etching stop during the contact-hole etching.

FIG. 6 shows a semiconductor component according to the invention using a memory module as an example. The memory module includes a multiplicity of individual memory cells 200 including a first electrode 205, a dielectric 210 and a second electrode 215. A selection transistor configured below the first electrode 205 is not illustrated here. The electrodes 205 and 215 are composed of platinum or another metal having a low reactivity. Ceramic materials having an extremely high dielectric constant, e.g. barium strontium titanate or ferroelectric ceramic materials, e.g. strontium bismuth tantalate, are used as the dielectric 210. A silicon layer 220 used as a hard mask is configured on the second electrode 215. The memory cell 200 is completely covered with an oxide layer 225. A further metal layer 230 in the form of a wiring plane is configured on the oxide layer 225. An electrically conductive connection between the second electrode 215 and the further metal layer 230 is produced through a contact hole 235 filled with a conductive material. In this case, the silicon layer 220 serves, on the one hand, as an electrically conductive contact to the material situated in the contact hole and, on the other hand, as an adhesion promoter between the second electrode 215 and the oxide layer 225. The silicon layer 220 used for jointly patterning the second electrode 215 and the dielectric 210 thus remains on the second electrode 215 and does not have to be removed from the latter by an additional etching operation.

We claim:

1. A method for fabricating semiconductor components having an electrically conductive layer configured on a semiconductor substrate, which comprises:

applying a silicon mask layer to a conductive layer;

applying an etching mask to the conductive layer for patterning the silicon mask layer;

selectively etching the silicon mask layer using the etching mask; and patterning the conductive layer in an etching process using the selectively etched mask layer as a hard mask.

2. The method according to claim 1, which comprises:

leaving the silicon mask layer on the conductive layer after the conductive layer has been patterned; and using the silicon mask layer as an adhesion promoting layer between the conductive layer and a further layer that is deposited.

3. The method according to claim 1, which comprises adapting a thickness of the silicon mask layer to reduce reflections during photolithographic patterning of its etching mask.

4. The method according to claim 1, which comprises using the silicon layer as an etching stop for protecting the conductive layer.

5. The method according to claim 1, wherein the silicon layer is a layer selected from the group consisting of an amorphous layer and a polycrystalline layer.

6. The method according to claim 1, which comprises doping the silicon layer.

7. The method according to claim 1, which comprises using the silicon layer as a hard mask while selectively etching a layer sequence which includes the conductive layer and a dielectric.

8. The method according to claim 1, which comprises using a metal layer as the conductive layer.

9. The method according to claim 8, wherein the metal layer includes a metal selected from the group consisting of platinum, iridium, palladium, and ruthenium.

10. The method according to claim 1, wherein the conductive layer is a layer selected from the group consisting of iridium oxide and ruthenium oxide.

11. A semiconductor component comprising:

a semiconductor substrate;

a conductive layer configured on said semiconductor substrate;

a mask layer covering said conductive layer, said mask layer being a silicon layer; and a further layer configured above said conductive layer and connected to said conductive layer with said mask layer interposed therebetween, said further layer having a contact hole therethrough for making contact with said conductive layer, said contact hole extending at least to said mask layer;

said conductive layer being a layer selected from the group consisting of platinum, iridium, palladium, ruthenium, an alloy of at least one of the abovementioned metals, iridium oxide, and ruthenium oxide.

* * * * *